United States Patent
Crump et al.

(10) Patent No.: US 7,353,437 B2
(45) Date of Patent: Apr. 1, 2008

(54) SYSTEM AND METHOD FOR TESTING A MEMORY FOR A MEMORY FAILURE EXHIBITED BY A FAILING MEMORY

(75) Inventors: Valerie Crump, Boise, ID (US); Brad Van Roosendaal, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 212 days.

(21) Appl. No.: 10/977,391

(22) Filed: Oct. 29, 2004

(65) Prior Publication Data

US 2006/0107132 A1    May 18, 2006

(51) Int. Cl.
  *G11C 29/00*    (2006.01)
  *G01R 31/28*    (2006.01)

(52) U.S. Cl. ..................... 714/718; 714/724

(58) Field of Classification Search ............. 714/718, 714/738
See application file for complete search history.

(56) References Cited

U.S. PATENT DOCUMENTS

| | | | |
|---|---|---|---|
| 5,243,603 A * | 9/1993 | Broeren ................... 714/738 |
| 5,325,309 A | 6/1994 | Halaviati et al. ............ 364/488 |
| 5,737,520 A | 4/1998 | Gronlund et al. ...... 395/183.15 |
| 5,913,022 A * | 6/1999 | Tinaztepe et al. .......... 714/25 |
| 5,956,477 A | 9/1999 | Ranson et al. ........ 395/183.06 |
| 5,978,902 A | 11/1999 | Mann ..................... 712/227 |
| 6,151,567 A | 11/2000 | Ames et al. .............. 703/13 |
| 6,327,556 B1 * | 12/2001 | Geiger et al. ............. 703/13 |
| 6,421,790 B1 | 7/2002 | Fruehling et al. ........... 714/30 |
| 6,499,123 B1 | 12/2002 | McFarland et al. ......... 714/724 |
| 6,993,695 B2 * | 1/2006 | Rivoir .................... 714/734 |
| 2002/0157042 A1 | 10/2002 | Krech, Jr. et al. ......... 714/45 |
| 2002/0194558 A1 * | 12/2002 | Wang et al. .............. 714/718 |
| 2003/0037305 A1 | 2/2003 | Chen et al. ................ 716/4 |
| 2003/0046671 A1 | 3/2003 | Bowen ................... 717/141 |
| 2003/0069724 A1 | 4/2003 | Schubert et al. ............. 703/16 |
| 2003/0131325 A1 | 7/2003 | Schubert et al. ............. 716/4 |
| 2003/0145261 A1 * | 7/2003 | Tanizaki .................. 714/718 |
| 2003/0182642 A1 | 9/2003 | Schubert et al. ............. 716/4 |
| 2003/0188299 A1 | 10/2003 | Broughton et al. ......... 717/141 |

* cited by examiner

*Primary Examiner*—Cynthia Britt
(74) *Attorney, Agent, or Firm*—Dorsey & Whitney LLP

(57) ABSTRACT

A system and method for testing a memory under test on automated test equipment (ATE) that includes capturing operating conditions for a memory exhibiting a memory failure in a sequence of records corresponding the operating conditions over a period of time that includes the occurrence of the memory failure and further includes executing a software translation module to generate a file of test vectors from the sequence of records that when executed by the ATE reproduces the operating condition over the sampled period of time. The memory under test is tested according to the file of test vectors for the ATE.

29 Claims, 4 Drawing Sheets

SYSTEM AND METHOD FOR TESTING A MEMORY FOR A MEMORY FAILURE EXHIBITED BY A FAILING MEMORY

TECHNICAL FIELD

The present invention relates in general to testing memory circuits, and more particularly, to a system and method for developing a vector test pattern from sampled operating conditions under which a failing memory exhibits a memory failure.

BACKGROUND OF THE INVENTION

Memory systems are used in a variety of applications where there is a need to store and access digital data, such as a computer system. During operation, memory systems occasionally fail to provide the data as stored. As a result, an error occurs. A memory system failing to provide correct data can be caused by several reasons. For example, the memory system is being operated under conditions that violate published specifications, the memory system has either a manufacture or design defects that escaped screening by final testing by the manufacturer, or the memory system is a random failure that escaped reliability and "burn-in" testing. When a memory system fails in the field, the manufacturer performs failure analysis on the memory system to determine the cause, or failure mode, of the failure. The manufacturer can then decide what corrective measures need to be taken to resolve the failures. This includes changing operating specifications for the memory system, implementing additional tests to screen out those memory systems most likely to fail under similar system operating conditions, and if necessary, modifying the design of the memory system.

As part of the failure analysis, a test algorithm or program simulating the memory system operating conditions causing the failure is developed so that the failures can be repeated in a controlled environment. The test program is typically developed for automated test equipment (ATE) designed for testing memory systems. Many such ATEs are available from companies, including Advantest, Schlumberger, Agilent, Credence, and several others. Current ATEs have the capability to perform testing by executing a test program having algorithmic test patterns, vector test patterns, or both. Generally, algorithmic test patterns are written as algorithms executed on test pattern generators in an ATE that exercise the memory system during testing. In contrast, vector test patterns are written as a series of commands, or test vectors, for the ATE that specify which signals and the logic states of those signals are to be applied to the memory system under test. As the series of test vectors are executed by the ATE, the memory system under test is exercised.

FIG. 1 is a block diagram illustrating various tools that are utilized during failure analysis of a memory system 102 that is included in a processing system 103. The memory system 102 represents various types of memory systems, including individual memory devices, memory modules, and systems having a plurality of memory devices or memory modules. In the present example, the memory system 102 is experiencing failures when operating in the processing system 103. Operation of the tools shown in FIG. 1 will be explained with reference to FIG. 2, which is a flow diagram illustrating the general process of developing a test program for an ATE 120 (FIG. 1) using the conventional analysis tools. The process begins at step 202 with sampling and recording the system operating conditions for the memory system 102 leading up to and including when a failure occurs in the memory system 102. Typically, a logic analyzer 104 or similar tool coupled to the memory system 102 is used to capture the logic states of various signals applied to the memory system 102 during operation in the processing system 103 at different clock cycles of a clock signal, which is also applied to the memory system 102. A record is created and stored for each point in time at which the logic states of the different signals applied to the memory system 102 are captured, and as the sampling at different points of time continues, a stored sequence of records is developed that provides a log of the system operating conditions resulting in the memory system failure.

The sequence of records generated by the logic analyzer 104 is converted into a textually formatted sequence of records 112, either directly by the logic analyzer 104, or as shown in FIG. 1, by a computer 108 that receives the sequence of records from the logic analyzer 104 and converts the sequence of records into the textually formatted sequence of records 112. At a step 204, the textually formatted sequence of records 112 is interpreted by an engineer whose task it is to develop a test program for the ATE 120 at a step 206 that can be used to confidently replicate failure of the memory system 102 in a controlled test environment. Where a test program having algorithmic test patterns is developed by the engineer, the algorithmic test patterns are loaded into a algorithmic test memory 130 for execution by the ATE 120. The ATE 120 further includes a vector test memory 140 for storing vector test patterns included in the test program which are executed on the ATE 120.

The test program is executed by the ATE 120 to test a memory system under test 124, which can represent the failing memory system 102, as well as memory systems that are the same as the memory system 102. The test program is used as part of the failure analysis process of determining the specific failure mode of the memory system 102 since understanding the specific operating conditions under which the memory system 102 fails can often provide valuable insight to the actual failure mode. As previously discussed, a test program developed by the engineer can be included in a production level test to screen out memory systems likely to experience the same failures as the memory system 102. Typically, production level tests primarily include algorithmic test patterns due to size constraints of the vector test memory 140 of the ATE 120, as well as the greater speed at which algorithmic test patterns can be executed by the ATE 120.

The process of developing a suitable test program from the textually formatted sequence of records 112 is resource intensive, often requiring many hours to review the sequence of records and develop a test program for the ATE 120 to reliably repeat the memory system failure. The system operating conditions causing a memory system failure can span thousands, if not millions of clock cycles. As a result, the textually formatted sequence of records 112 can be quite large, including considerable extraneous information unrelated to the specific cause of the failure. However, if the number of records of a sequence is reduced, the resulting textually formatted sequence of records 112 may have a sample resolution that fails to provide an adequately detailed history of the system operating conditions leading up to the failure to be used in developing a test program. Additionally, when a suspicious set of system operating conditions is identified from the sequence of records, manually developing a test program for the ATE 120 can be tedious and error-prone. Therefore, there is a need for an alternative system and method that facilitates analyzing failures of a memory system and developing a test program for an ATE that replicates the operating condition causing the memory system to fail.

SUMMARY OF THE INVENTION

In one aspect of the invention a method for testing a memory under test on automated test equipment (ATE) includes capturing operating conditions for a memory exhibiting a memory failure in a sequence of records representing the operating conditions over a period of time that includes the occurrence of the memory failure. The method further includes executing a software translation module to generate a file of test vectors from the sequence of records that when executed by the ATE reproduce the operating condition over the sampled period of time and testing the memory under test according to the file of test vectors for the ATE. In another aspect of the invention, a system for analyzing a memory exhibiting a memory failure includes a logic analyzer, a computer, and an ATE. The logic analyzer is coupled to the memory and is configured to sample the operating conditions for the memory exhibiting the memory failure over a period of time that includes the occurrence of the memory failure. The samples are stored in a sequence of records corresponding the operating conditions. The computer includes a software translation module and is configured to execute the translation module to generate a file of test vectors from the sequence of records that corresponds to the sampled operating conditions. The ATE includes a vector memory in which the file of test vectors can be stored and is configured to execute the file of test vectors when stored in the vector memory to reproduce the operating conditions over the sampled period of time for a memory under test.

DETAILED DESCRIPTION OF PREFERRED EMBODIMENTS

Certain details are set forth below to provide a sufficient understanding of the invention. However, it will be clear to one skilled in the art that the invention may be practiced without these particular details. In other instances, well-known circuits, control signals, timing protocols, and software operations have not been shown in detail in order to avoid unnecessarily obscuring the invention.

Figure 1:
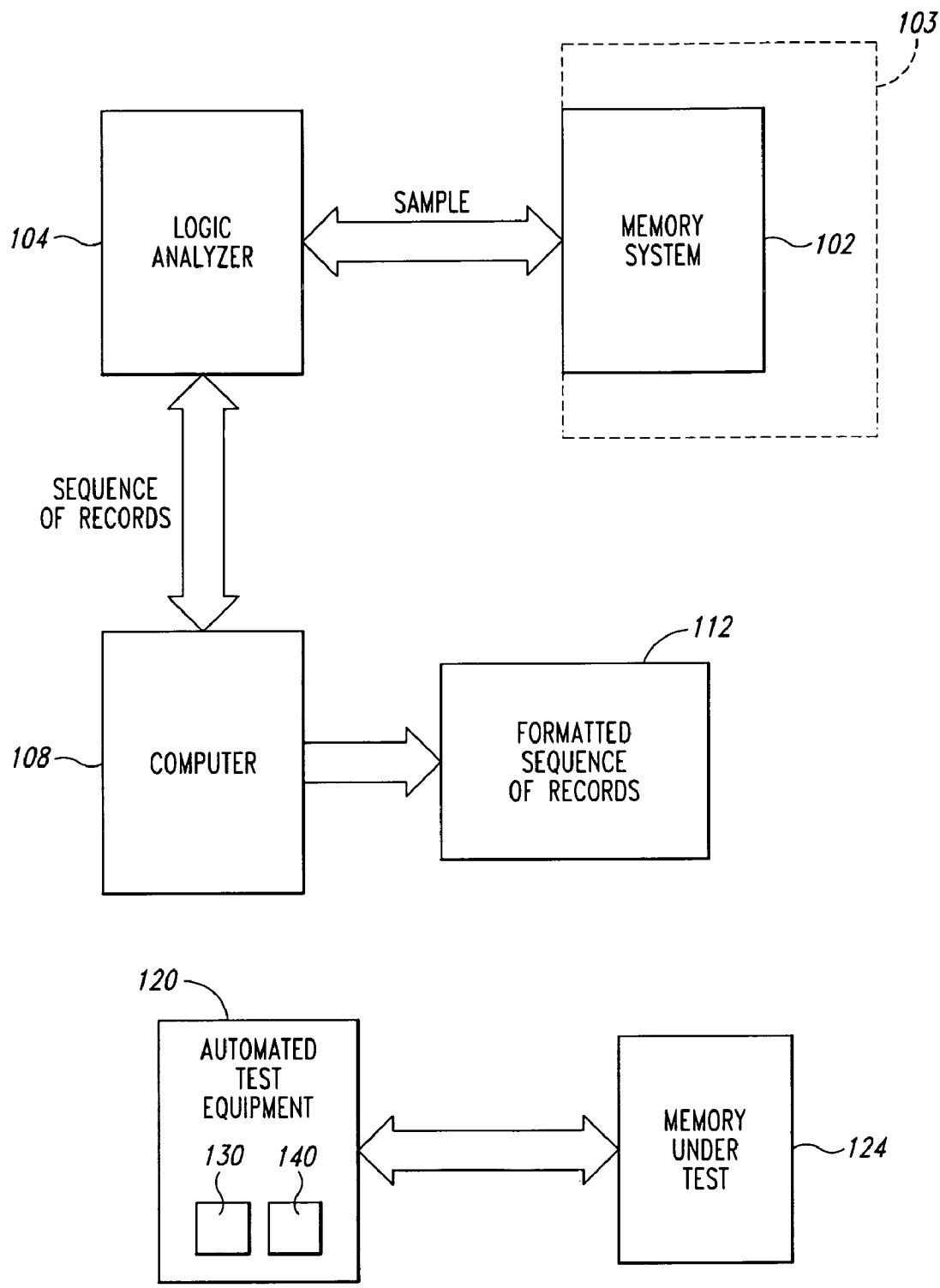
FIG. 1 is a block diagram of analysis tools used for conventional failure analysis of a memory system.
Figure 2:
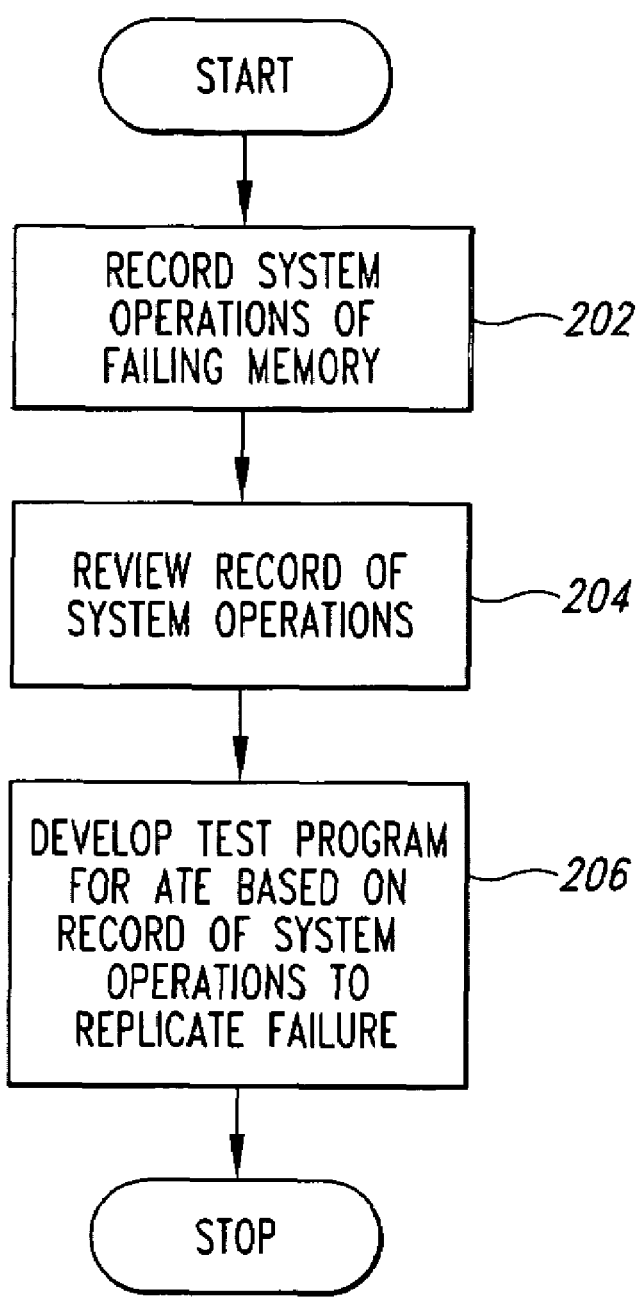
FIG. 2 is a flow diagram of a conventional process for developing a test program during failure analysis of a memory system using the analysis tools shown in FIG. 1.
Figure 3:
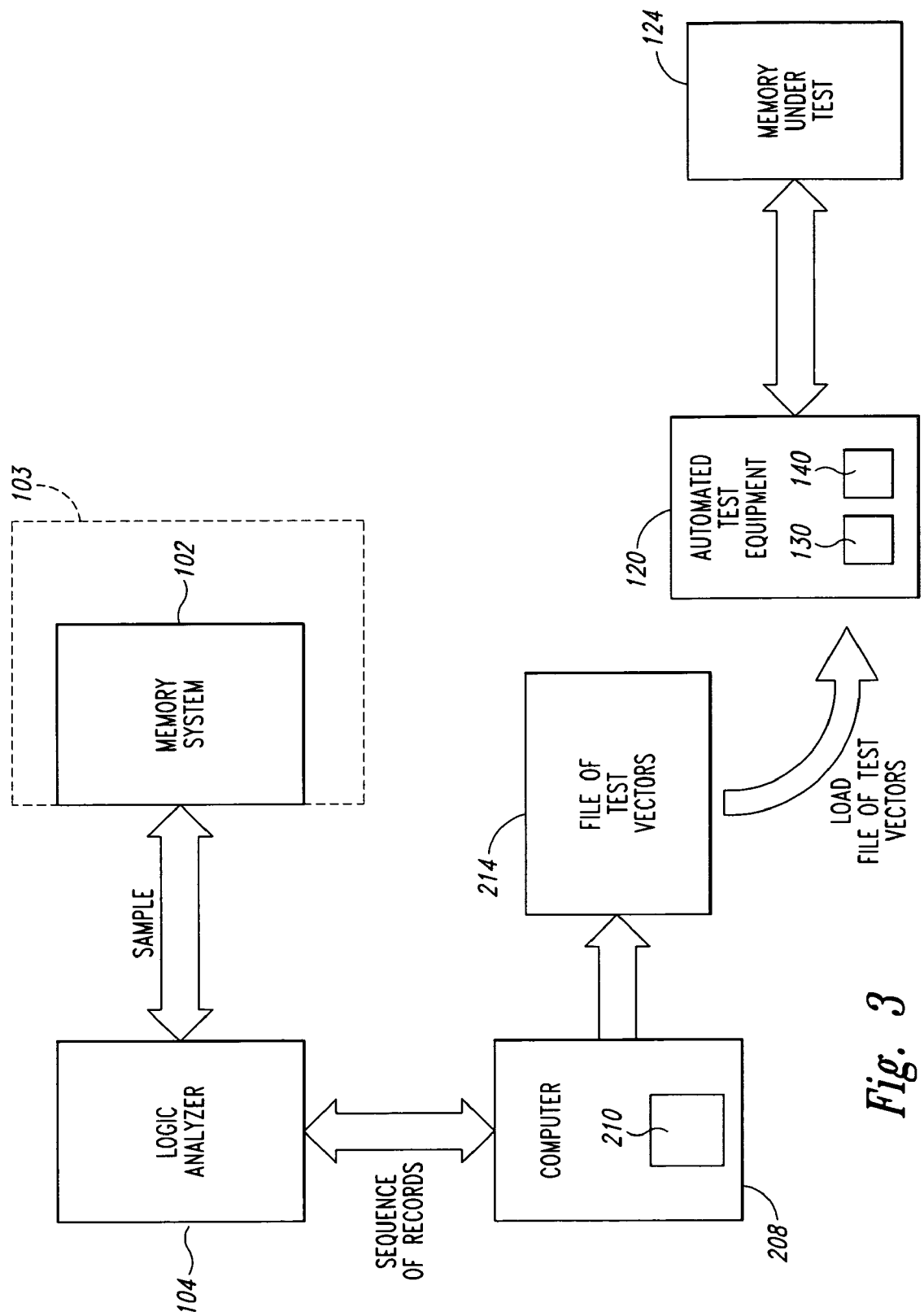
FIG. 3 is a block diagram of analysis tools used for failure analysis of a memory system according to an embodiment of the present invention.

FIG. 3 illustrates analysis tools used in failure analysis of a memory system according to an embodiment of the present invention. Some of the tools shown in FIG. 3 have been previously described with respect to FIG. 1, and are identified in FIG. 3 by the same reference numbers. As previously described, memory system operating conditions for a failing memory system 102 that is in a processing system 103 are sampled and recorded by a logic analyzer 104 coupled to the memory system 102. A sequence of records that log the system operating conditions before and including the occurrence of the failure is assembled by the logic analyzer 104 into an electronic file (not shown) that is uploaded to a computer 208. The computer 208 includes a translation module 210 that translates the sequence of records from the logic analyzer 104 into a file of test vectors 214. The file of test vectors 214 is uploaded to a vector test memory 140 in a ATE 120 that is coupled to a memory system under test 124. As previously described, the memory system under test 124 can represent the failing memory system 102, as well as represent a memory system that is the same-type as the failing memory system 102. The test vectors of the file of test vectors define the timing and logic level of signals that are applied to the memory system under test 124. As the test vectors are executed by the ATE 120 and the signals are applied to the memory system under test 124, the system operating condition causing the failure of the memory system 102 is recreated with respect to the memory system under test 124, which can be observed in a controlled testing environment for the failure. The translation module can be implemented as a software program that is executed by the computer 208 to generate the file of test vectors 214. Alternatively, in another embodiment a combination of computer hardware and computer software are used for implementing the translation module 210.

In addition to translating the individual records of the sequence of records into test vectors corresponding to the captured system operating condition, the translation module 210 can generate test vectors to be included in the file of test vectors 214 to set up background condition for the memory system under test 124 before testing begins. For example, test vectors for writing background data to the memory system under test 124 can be generated, as well as test vectors for establishing operating modes of the memory system under test 124, such as CAS latency, system clock speed, and the like. Typically, the test vectors setting up the background conditions are appended before the test vectors corresponding to the sequence of records in order for the memory system under test 124 to be in the correct setup before system operating conditions leading up to the failure are applied.

Figure 4:
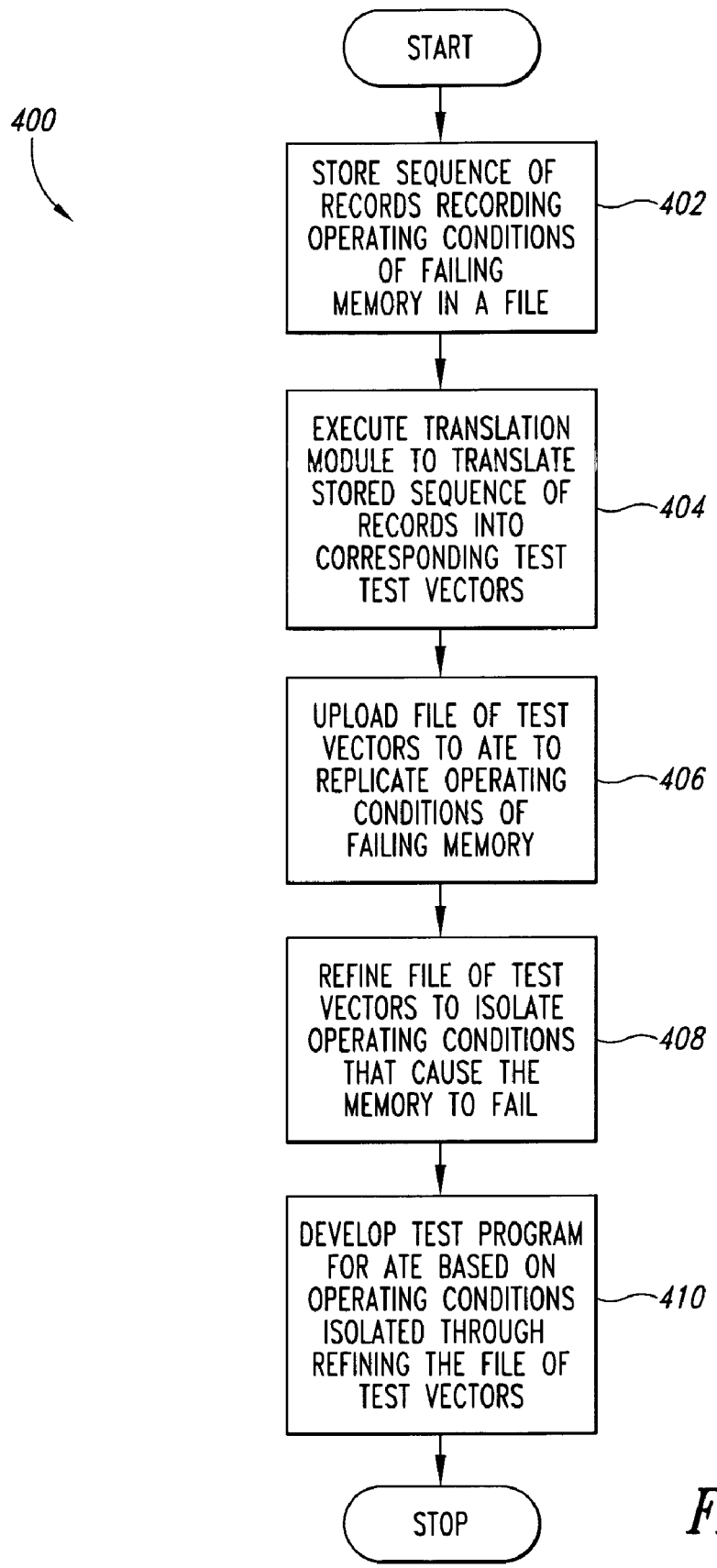
FIG. 4 is a flow diagram for developing a test program during failure analysis of a memory system according to an embodiment of the present invention using the analysis tools shown in FIG. 3.

FIG. 4 illustrates a process 400 of developing a test program according to an embodiment of the present invention. Although the process 400 will be described with reference to the analysis tools shown in FIG. 3, other analysis tools can be used as well. At a step 402, a file including a sequence of records is generated by the logic analyzer 104. As previously discussed, each of the records in the sequence includes information regarding the signals applied to the memory system 102 at a particular moment in time, which is typically identified by the rising or falling edge of the clock cycle at which the signals are sampled. The records are recorded over a period of time that precedes and includes when the memory system 102 fails. The resulting sequence of records essentially captures the operating conditions under which the failure of the memory system 102 occurs. At a step 404, the file of the sequence of records is uploaded to the computer 208 that includes the translation module 210 for translating the sequence of records into a file of test vectors 214. The file of test vectors 214 corresponds to the recorded operating conditions sampled by the logic analyzer 104.

At a step 406, the file of test vectors 214 is uploaded to the vector test memory 140 and is executed by the ATE 120 to replicate the operating conditions which cause the memory system 102 to fail. That is, as the test vectors are executed by the ATE 120, the signals and logic states of those signals as captured by the logic analyzer 104 are applied by the ATE 120 to the memory system under test 124 in the sequence and at the appropriate times to recreate the operating conditions under which the memory system 102 experienced a failure. Typically, the logic analyzer 104 samples and captures the sequence of command signals, data signals, and address signals applied to the memory system 102 in the records which are then translated by the translation module 208 into test vectors for the ATE 120.

The translation of the sequence of records into a file of test vectors, and the execution of the test vectors by the ATE 120 to replicate the operating conditions surrounding the failure of the memory system avoids the need to review a textually formatted sequence of records, as is conventionally done, and further facilitates isolating the operating condition that causes the memory system 102 to fail. As the test vectors are executed by the ATE 120, the operation of the memory system under test 124 leading up to and including when the failure occurs can be observed. The file of test vectors 214 can be refined at a step 408 by editing the test vectors to isolate the operating condition that causes the memory system 102 to fail. For example, test vectors corresponding to illegal operations that are identified by observing the operation of the memory system under test 124 or by reviewing the test vectors can be selectively removed from the file of test vectors 214. Removal of these test vectors allows the determination of whether the illegal operations are the cause of the failure. That is, if the test vectors corresponding to the illegal operation are removed, and the memory system under test 124 no longer fails when the remaining test vectors are executed, there is a strong likelihood that the illegal operation is related to the cause of the failures. Further refinement can be made by editing the file of test vectors 214 to correct timing violations or add margin to timing specifications. As with the removal of the test vectors corresponding to the illegal operations, by correcting any timing violations or adding margin to timing specifications one can determine whether the illegal or marginal/tight timing is the cause of the failures.

The use of test vectors further allows control over the data and data mask signals applied to the memory system under test 124. The data can be controlled by editing the file test vectors 214 to set the desired logic levels for the data and data mask signals to different logic levels and with different timing than that sampled by the logic analyzer 104 and translated into test vectors if desired. Alternatively, the data signals can be specified by the user rather than simply reapplying the same data and data mask signals sampled by the logic analyzer 104 and translated into test vectors. Data read from the memory system under test 124 is compared to write data stored in a database in order to determine whether a failure occurs. In the case where the memory system 102 and the memory system under test 124 represent a memory module having a plurality of memory devices, the sampled read data from the failing memory module 102 can be parsed and reordered to match the data of a particular failing memory device. As a result, the system operating condition for a single memory device on the memory module 102 can be accurately reproduced.

Through a process of elimination, the file of test vectors 214 can be refined by selectively editing the test vectors to isolate the system operating condition causing the failures. The process facilitates failure analysis of the memory system 102 by providing a mechanism to easily replicate the system operating conditions leading up to and including the failure without the need to review any textually formatted records. Additionally, the process facilitates systematically parsing the system operating conditions vis-à-vis the test vectors to isolate the failing condition for the memory system 102. When the cause of the failures is isolated, and can be confidently repeated by executing the refined file of test vectors, at a step 410 an algorithmic test can be developed if desired. As previously discussed, the algorithmic test can be added to a production-level test for screening the same failure-mode from memory systems that are the same as the memory system 102 to prevent future failures in the field. Additionally, the isolated system operating condition causing the memory system 102 to fail provides some insight to the actual failure mode of the memory system 102. Additional tests can be developed, using vector test patterns, algorithmic test patterns, or both, to confirm suspected failure modes suggested by the isolated system operating conditions.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for testing a memory on automated test equipment (ATE) having a test vector memory, the method comprising:
    sampling operating conditions for a memory exhibiting a memory failure, the sampling occurring over a period of time that includes the occurrence of the memory failure;
    creating a sequence of records representing the sampled operating conditions over the period of time;
    executing a software translation module to translate the sequence of records representing the sampled operating conditions into a file of test vectors for execution by the ATE to generate the sampled operating conditions under which the memory failure occurred;
    loading the file of test vectors into the test vector memory;
    editing the file of test vectors to apply data signals representing data states that are different than the sampled data states; and
    executing the file of test vectors on the ATE to test the memory according to the test vectors.

2. The method of claim 1 wherein creating a sequence of records comprises creating a record for each sample of the operating conditions.

3. The method of claim 2 wherein creating a record for each sample of the operating conditions comprises recording a clock cycle identifier for each sample and recording the logic states for a plurality of signals applied to the memory exhibiting a memory failure.

4. The method of claim 1, further comprising editing the file of test vectors to remove illegal memory operations.

5. The method of claim 1, further comprising editing the file of test vectors to remove signal timing violations.

6. The method of claim 1, further comprising editing the file of test vectors to add timing margin to timing specifications for the memory.

7. The method of claim 1 wherein sampling operating conditions for a memory exhibiting the memory failure comprises capturing for a plurality of clock cycles the logic state of a plurality of signals applied to the memory for each of the respective clock cycles.

8. The method of claim 1, further comprising adding test vectors to the file of test vectors for establishing background data stored by the memory under test.

9. The method of claim 1, further comprising adding test vectors to the file of test vectors for setting operating conditions of the memory under test.

10. A method for testing a memory under test on automated test equipment (ATE), the method comprising:
capturing operating conditions for a memory exhibiting a memory failure in a sequence of records representing the operating conditions over a period of time that includes the occurrence of the memory failure;
executing a software translation module to generate a file of test vectors from the sequence of records representing the operating conditions of the memory that when executed by the ATE reproduce the operating condition over the sampled period of time;
editing the file of test vectors; and
testing the memory under test according to the file of test vectors for the ATE.

11. The method of claim 10 wherein capturing operating conditions in a sequence of records comprises:
sampling the operating conditions at a plurality of clock cycles of a clock signal applied to the memory exhibiting the memory failure; and
creating a record for each sample of the operating conditions.

12. The method of claim 11 wherein creating a record for each sample of the operating conditions comprises recording a clock cycle identifier for each sample and recording the logic states for a plurality of signals applied to the memory exhibiting a memory failure.

13. The method of claim 10 wherein editing the file of test vectors comprises editing the file of test vectors to remove illegal memory operations.

14. The method of claim 10 wherein editing the file of test vectors comprises editing the file of test vectors to remove signal timing violations.

15. The method of claim 10 wherein editing the file of test vectors comprises editing the file of test vectors to add timing margin to timing specifications for the memory.

16. The method of claim 10 wherein editing the file of test vectors comprises editing the file of test vectors to apply data signals representing data states that are different than the sampled data states.

17. The method of claim 10, further comprising adding test vectors to the file of test vectors for establishing background data stored by the memory under test.

18. The method of claim 10, further comprising adding test vectors to the file of test vectors for setting operating conditions of the memory under test.

19. A method for developing an algorithmic test program for automated test equipment (ATE), the method comprising:
sampling operating conditions for a first memory exhibiting a memory failure over a period of time that includes the occurrence of the memory failure;
generating a sequence of records from the sampled operating conditions that include information representing the sampled operating conditions of the memory exhibiting the memory failure over the period of time;
executing a software translation module to generate a file of test vectors from the sequence of records that includes information representing the sampled operating conditions that when executed by the ATE reproduce the operating condition over the sampled period of time and thereby reproduce the memory failure in any memory with the same faults as the first memory;
testing a memory under test according to the file of test vectors for the ATE;
editing the file of test vectors to isolate a failing operating condition that causes the memory under test to exhibit the memory failure; and
developing an algorithmic test program based on the edited file of test vectors that recreates the failing operating condition.

20. The method of claim 19 wherein editing the file of test vectors comprises editing the file of test vectors to remove illegal memory operations.

21. The method of claim 19 wherein editing the file of test vectors comprises editing the file of test vectors to remove signal timing violations.

22. The method of claim 19 wherein editing the file of test vectors comprises editing the file of test vectors to add timing margin to timing specifications for the memory.

23. A system for analyzing a memory exhibiting a memory failure, comprising:
a logic analyzer coupled to the memory, the logic analyzer configured to sample the operating conditions for the memory exhibiting the memory failure over a period of time that includes the occurrence of the memory failure and store the samples in a sequence of records representing the operating conditions;
a computer having a software translation module, the computer configured to execute the translation module to generate a file of test vectors from the sequence of records representing the operating conditions that corresponds to the sampled operating conditions; and
automated test equipment (ATE) having a vector memory in which the file of test vectors can be stored and further having a test interface to which a memory under test is coupled for testing, the ATE configured to execute the file of test vectors when stored in the vector memory to reproduce the operating conditions over the sampled period of time for a memory under test coupled to the test interface and, after executing the file of test vectors, for editing the file of test vectors.

24. The system of claim 23 wherein the logic analyzer comprises a logic analyzer configured to sample for a plurality of clock cycles of a clock signal applied to the memory exhibiting a memory failure the data state for a plurality of signals applied to the memory exhibiting a memory failure at each of the sampled clock cycles.

25. The system of claim 23 wherein the ATE comprises an ATE further having an algorithmic memory for storing an algorithmic test program.

26. The system of claim 23 wherein the ATE configured for editing the file of test vectors is further configured for editing the file of test vectors to remove illegal memory operations.

27. The system of claim 23 wherein the ATE configured for editing the file of test vectors is further configured for editing the file of test vectors to remove signal timing violations.

28. The system of claim 23 wherein the ATE configured for editing the file of test vectors is further configured for editing the file of test vectors to add timing margin to timing specifications for the memory.

29. The system of claim 23 wherein the ATE configured for editing the test vectors is further configured for editing the file of test vectors to apply data signals representing data states that are different than the sampled data states.

* * * * *